(12) United States Patent
Guignet et al.

(10) Patent No.: US 6,243,848 B1
(45) Date of Patent: Jun. 5, 2001

(54) PROCESS FOR ANALYZING COMPLEX STRUCTURES AND SYSTEM FOR IMPLEMENTING A PROCESS OF THIS TYPE

(75) Inventors: Jean-Bruce Guignet, Les Clayes sous Bois; Denis Barbier, Adainville, both of (FR)

(73) Assignee: Bull S.A., Louveciennes (FR)

( * ) Notice: Subject to any disclaimer, the term of this patent is extended or adjusted under 35 U.S.C. 154(b) by 0 days.

(21) Appl. No.: 08/947,147

(22) Filed: Oct. 8, 1997

(30) Foreign Application Priority Data

Oct. 9, 1996 (FR) .................................................. 96 12317

(51) Int. Cl.[7] ..................................................... G06F 17/50
(52) U.S. Cl. ...................................... 716/1; 716/3; 716/11
(58) Field of Search ...................................... 364/488, 489, 364/490, 491, 468.27, 900; 395/500; 716/18, 1, 2, 3, 11

(56) References Cited

U.S. PATENT DOCUMENTS

| | | | | |
|---|---|---|---|---|
| 4,813,013 | * | 3/1989 | Dunn ..................................... | 364/900 |
| 5,493,508 | | 2/1996 | Dangelo et al. . | |
| 5,790,414 | * | 8/1998 | Okano et al. ......................... | 364/488 |
| 5,802,349 | * | 9/1998 | Rigg et al. ............................ | 395/500 |
| 5,867,399 | * | 2/1999 | Rostoker et al. ..................... | 364/489 |
| 5,937,190 | * | 8/1999 | Gregory et al. ...................... | 395/704 |

FOREIGN PATENT DOCUMENTS 9527948   10/1995 (WO) .

OTHER PUBLICATIONS

Shigehiro et al. "Automatic Layout Recycling Based on Layout Description and Linear Programming," IEEE Transactions on Computer–Aided Design of Integrated Circuits and Systems, vol. 15, No. 8, Aug. 1996.*

Horta and Franca "Formal Description of Data Conversion Algorithms for Automatic Synthesis," Proceedings of the 37th Midwest Symposium on Circuits and Systems, 1994.*

Bonnardel and Raphalen "An Open Characterization Component Tool," IEEE, 1992.*

Proceedings of European Design and Test Conference, Mar. 11–14, 1996, Paris, France, p. 608 XP002034978, Guignet: "Generalized Recognition of Gates: a VLSI Abstraction Tool"* Entire document *.

* cited by examiner

Primary Examiner—Matthew Smith
Assistant Examiner—Leigh Marie Garbowski
(74) Attorney, Agent, or Firm—Miles & Stockbridge P.C.; Edward J. Kondracki

(57) ABSTRACT

In order to ensure the conformance of a structure to its original specification, to regenerate a structure in accordance with technological developments, or to compare a structure to another known structure, a process for analyzing an entire physical structure(21) includes a step(16) for executing set-based operations on subsets of the structure and producing a display of these subsets in statistical, structural or functional form. A data processing system including a first storage unit(1), a second storage unit(2) and an abstraction tool(14) which read-accesses the first storage unit(1) in order to replace the access to the data in a first area(MEMA) of the second storage unit(2) with an access to new data which gathers the data from the second storage unit(2), includes a graphical interface(7) for displaying the data accessed in the first area(MEMA) as well as the data accessed in a second area(MEMB) and in a third area(MEMC) of the second storage unit(2), an operator interface(5) for controlling the graphical interface(7); and first processing unit(8) controlled by the graphical interface(7) for executing set-based operations on the data accessed in the areas(MEMA, MEMB, MEMC) and transferring the result of said set-based operations to any of the areas(MEMA, MEMB, MEMC) of the second storage unit(2).

25 Claims, 2 Drawing Sheets

PROCESS FOR ANALYZING COMPLEX STRUCTURES AND SYSTEM FOR IMPLEMENTING A PROCESS OF THIS TYPE

FIELD OF THE INVENTION

The invention relates to the analysis of complex physical structures such as, for example, integrated circuits. This analysis is particularly useful for identifying the constituents of a structure, for ensuring the conformance of a structure to its original specification, for regenerating a structure in accordance with technological developments and for comparing a structure to another known structure.

DESCRIPTION OF PRIOR ART

A manufacturer of electric circuits must sometimes ensure the supply of its products for fairly long periods, for example as spare parts for expensive equipment. Keeping circuits of this type in stock is not economical; moreover, stored circuits can age and it is preferable to have new spare parts available as needed. On the other hand, maintaining an overabundant stock for the maintenance of this equipment may be unnecessary. That is why a manufacturer sometimes has to re-manufacture circuits it developed in the past. For integrated circuits, it uses archived computer files describing masks, which it retransmits to a semiconductor materials founder. However, these masks may be obsolete for various reasons having to do with technological development. In this case, it is necessary to generate masks that can be used with the current technologies. The current CAD (computer aided design) tools make it possible to generate descriptions from formal specifications. These formal specifications, stored in computer files, describe the expected functional behavior of the circuits to be produced.

A problem which the manufacturer is subject to is that it does not necessarily have formal specifications that can be directly used by current CAD tools to re-manufacture circuits whose behavior would be identical to that of the initial circuits. The reasons are manifold: the descriptive language may not be adapted to the available CAD tools, the formally described behavior may not exactly correspond to that of the circuit produced due to human intervention in various stages of the design of the masks, or in optimizations or modifications after testing. For these various reasons, mask description files represent the circuits produced more reliably, both structurally and functionally. However, they do not make it possible to directly generate new mask descriptions that can be used by the current manufacturing technologies at the time of a production rerun. On the other hand, mask descriptions present problems in understanding the functionalities of the circuit produced. This understanding may be necessary to adapt the circuit to current technology. In this case, a formal description facilitates analysis of the circuit produced.

The manufacturer may have in its archives connection lists (netlists) which enumerate the various elements of the circuit along with their interconnections and possibly also their physical position as they appear in the mask description files. These connection lists have often been generated in parallel with the generation of the existing masks. If the manufacturer does not have any connection lists, certain tools known as extractors make it possible to generate connection lists from mask description files. However, these connection lists represent complex structures which are difficult, is not impossible, to understand and analyze directly using known means.

It is therefore useful to be able to generate structural and behavioral descriptions from an existing circuit, in the form of a formal specification for use by CAD tools as well as for facilitating a functional understanding of the existing circuit.

A manufacturer may also wish to expand the performance of a circuit belonging to it by modifying some of its functions or the technology of some of its elements. The jumble, of different components of the circuit necessitates certain precautions to prevent the modifications from having harmful consequences on the global behavior of the circuit. It is therefore advantageous for the manufacturer to have the use of a circuit recognition process for generating new masks. The manufacturer may also wish to include in an existing circuit certain components of other circuits which belong to it and whose effects it knows. In this case, it is advantageous to have the use of a circuit recognition process for locating these components in the other existing circuits in order to generate new masks.

Complex structures are found not only in the field of integrated circuits but also in other technical fields such as, for example, organic chemistry. Complex molecules can result from production by man, but also from natural processes such as biological ones. It is now possible to list in computer files numerous nucleotide and amino acid sequences, some of whose effects are known. When faced with representations of sequences which are unknown, but for which the effects of certain sub-sequences may be known, it is advantageous to use the invention to recognize new sequences. In this case, the connection list is represented by the sequence representation in order to obtain a specification of effects produced by this sequence.

French patent application 9410260 filed Aug. 24, 1994 assigned to the assignee of the subject application and its U.S. counterpart Ser. No. 08/515,572, filed Aug. 16, 1995, now U.S. Pat. No. 5,734,572, the subject matter of which is hereby incorporated by reference, describes a tool that automatically produces an abstract specification of a physical system from a concrete description defining the structure of this system.

However, in analyzing the structure of a physical system, it is not necessarily desirable to obtain an abstract specification of the entire physical structure, but only to obtain a part of it, in accordance with specific interests. It is often difficult to extract a part of a structure whose complexity results in a confusion of its elements, both in their locations and in their interactions. For a complex structure comprising a considerable number of elements, the concrete description is presented in the form of a computerized data set.

OBJECT OF THE INVENTION

In order to eliminate this problem, a process for analyzing a computerized data set containing a connection list for describing a physical structure is provided which is characterized in that the process comprises a first step for executing set-based operations on subsets of the computerized data set and producing a display of these subsets in statistical, structural, schematic, electric or functional form.

However, it is possible for a part of a structure, even a limited one, to retain a high level of complexity. It is also possible for a structural description to be insufficient to achieve a technological migration which requires a functional specification.

In order to eliminate these additional problems, the invention also provides an analysis process characterized in that it comprises a first structural and functional abstraction step for generating a set of functional and structural computer data.

On the other hand, while regenerating a physical structure using only manual and intellectual methods is difficult, doing it in a purely automatic way risks creating problems of conformance between the structure produced and the structure expected. An automatic procedure does not allow the production of certain structures.

For this reason, the inventive process makes it possible, during analysis, to create a division between that which can be produced automatically and that which requires manual intervention. The invention also an analysis process characterized in that the first step controls an automatic synthesis step which generates, from the set of abstract computer data, a set of concrete computer data for regenerating a physical structure.

The knowledge required to produce a functional and structural abstraction of a physical structure that is unknown a priori is not always available.

For this reason, the invention also provides an analysis process characterized in that the first step generates a computerized data set which contains the knowledge for controlling the structural and functional abstraction step.

More particularly, in order to implement a process according to the invention, a data processing system comprises an abstraction tool, a first storage unit intended to contain data for parameterizing and controlling the abstraction tool, a second storage unit intended to contain data to be transformed by the abstraction tool, accessible in a first area of the second storage unit, and is characterized in that the system includes:

a graphical interface for displaying the data accessed in the first area as well as the data accessed in a second area and a third area of the second storage unit;

an operator interface for controlling the graphical interface; and first processing means controlled by means of the graphical interface for executing set-based operations on the data accessed in the first, second and third areas and transferring the result of these set-based operations into one of the areas of the second storage unit.

BRIEF DESCRIPTION OF THE DRAWINGS

A specific example of the implementation of the invention is described in reference to the following figures wherein.

DESCRIPTION OF THE PREFERRED EMBODIMENTS

Figure 1:
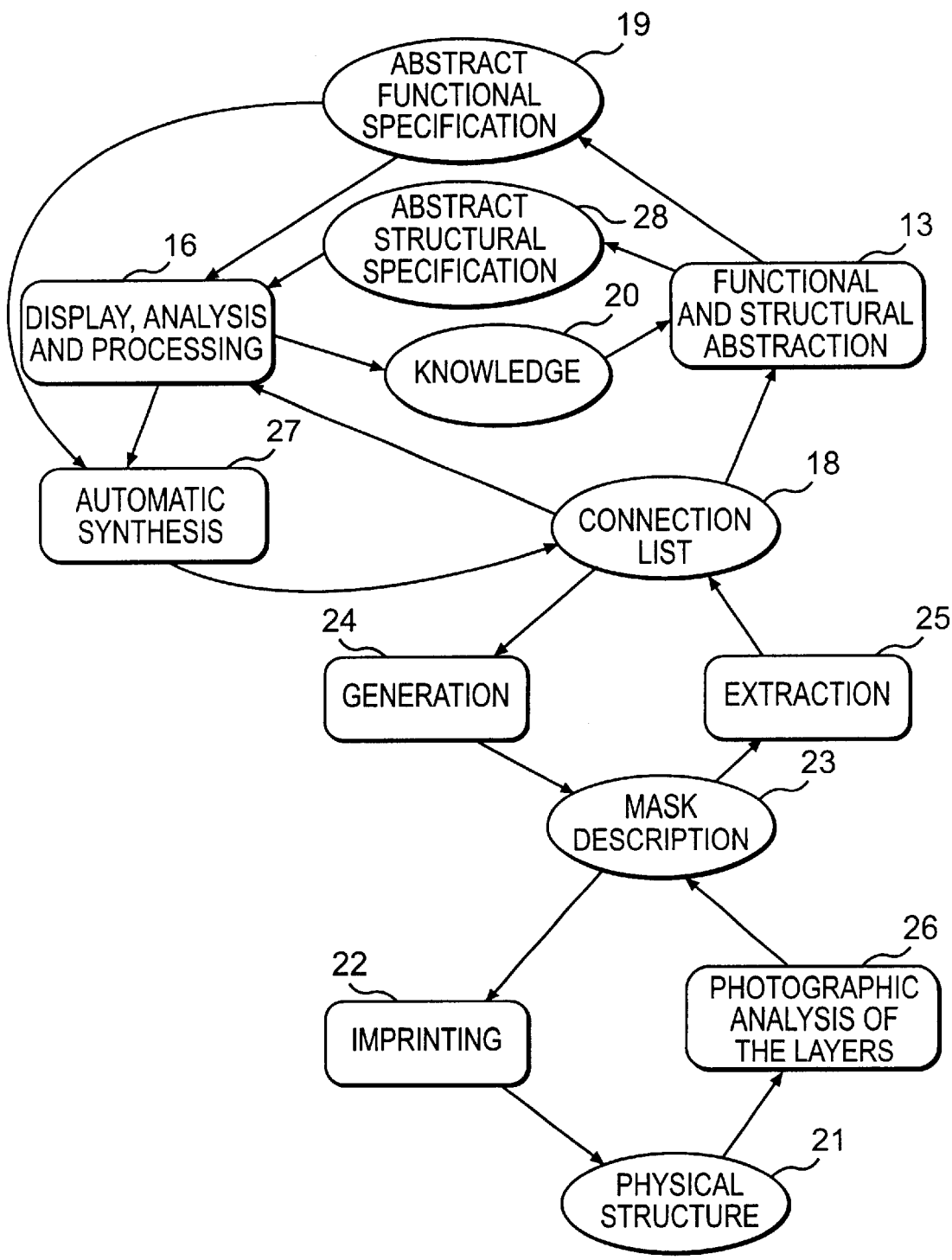
FIG. 1 is a global flow diagram representation of a process for regenerating complex structures.

According to FIG. 1, a computerized data set 18 contains a connection list describing a physical structure 21 that is complex in nature. As examples of physical structures 21, it is possible to cite, in a non-exhaustive way, macromolecules in the field of organic chemistry or integrated circuits in the field of electronics. In the case of macromolecules, the connection list contains a list of atoms constituting this macromolecule and a list of covalent bonds between these atoms.

In the particular case of integrated circuits, the connection list contains a list of components marked COMPONENT which constitute the circuit and a list of connections between these components. Among the components, a distinction is made between primitives, marked PRIMITIVE (transistors, resistors, diodes), and entities, marked ENTITY (elementary logic gates, inverters). Generally, the physical structure 21 in this case is obtained by means of a step 22 for imprinting the structure into semiconductor materials based on a mask description 23 that is itself obtained by means of a step 24 for generating a mask description from the connection list obtained in the computerized data set 18. In the absence of a connection list 18, it is possible to obtain a connection list from the mask description 23 through an extraction step 25. In the absence of a mask description 23, it is possible to obtain a mask description through a step for photographic analysis 26 of the layers of semiconductor material constituting the integrated circuit.

A step 16 analyzes the connection list and makes selections by executing set-based operations on various subsets of the computerized data set 18. To facilitate this analysis and selection phase, the step 16 can provide for a display of these subsets in various ways, for example in the form of a reduced connection list or in the form of statistical data developed from the data set 18 or from a computerized data set 28 containing an abstract structural specification. Another display of these subsets is provided in the form of abstract functional specifications obtained from a computerized data set 19. The step 16 makes it possible, for example, to transform the selected data by processing the selected data automatically using a format converter and manually using a text editor.

The computerized data sets 19 and 28 result from a functional and structural abstraction step on the computerized data set 18.

The step 16 is also intended to generate a computerized data set 20 describing the knowledge for controlling the abstraction step 13. An automatic synthesis step 27 makes it possible to generate a computerized data set 18 containing a new connection list. This new connection list makes it possible to regenerate a new physical structure 21 by going through the steps 22 and 24.

An additional advantage of the step 16 is obtained through its possible interactions with the step 27.

Figure 2:
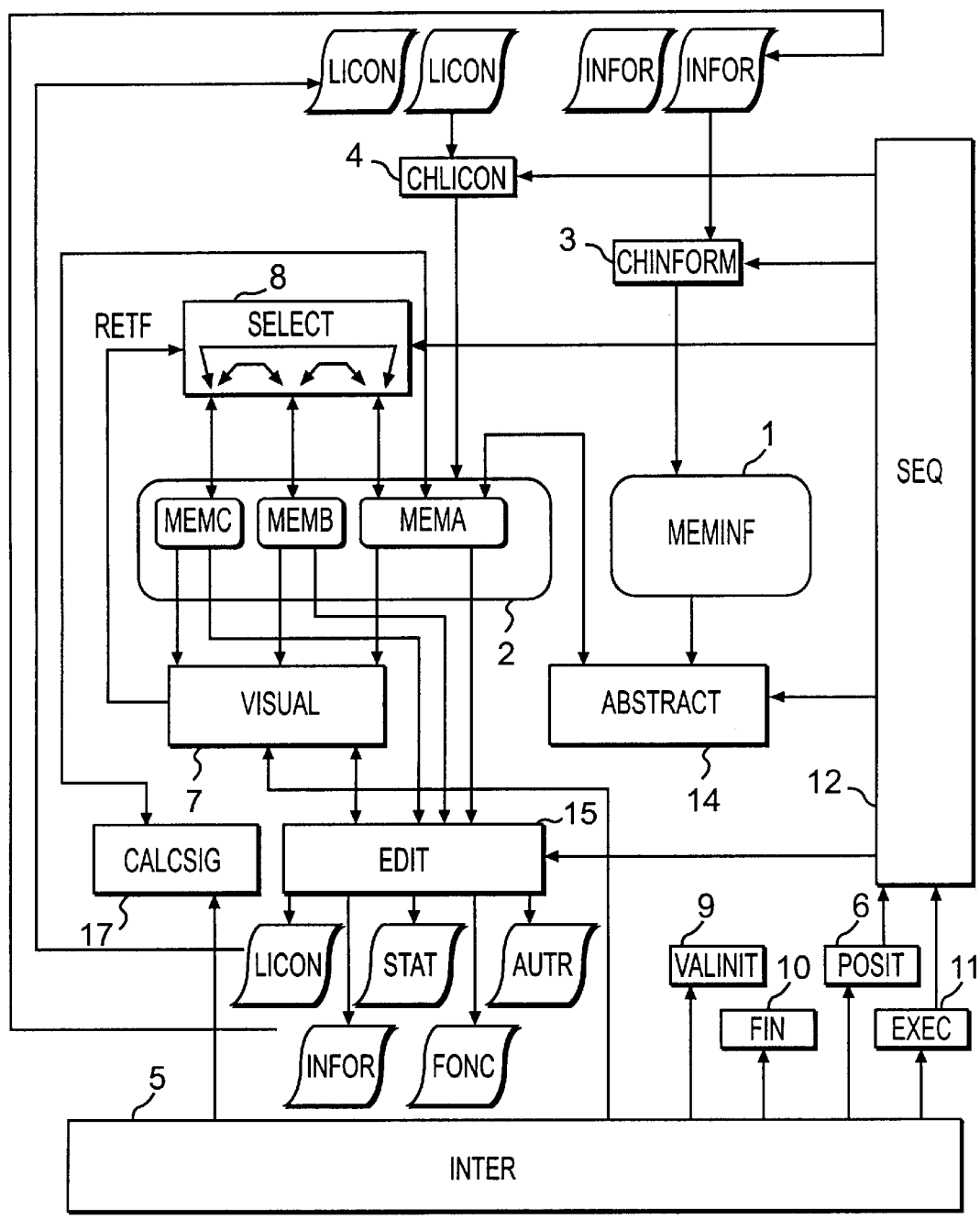
FIG. 2 is a representation of a data processing system according to the invention.

FIG. 2 presents the architecture of a system for implementing the invention. A storage unit 1 is write-accessible to an input interface 3 for storing in it knowledge originating from one or more files containing information presented in a given format INFOR. The input interface 3, controlled by a sequencer 12, organizes the information presented into knowledge that can be used directly by the system using a pre-programmed function CHINFORM. A storage unit 2 is write-accessible to an input interface 4 for storing in it data originating from one or more files containing a description of a physical structure presented in a given format LICON. The input interface 4, controlled by the sequencer 12, organizes the description presented into data that can be used directly by the system, using a pre-programmed function CHILCON; in particular, the function CHILCON makes the data accessible in an address storage area MEMA of the storage unit 2. An abstraction tool 14 read-accesses the storage unit 1 using an address storage area MEMINF of the storage unit 1. The abstraction tool 14 read- and write-accesses the storage unit 2 using the address storage area MEMA of the storage unit 2. The abstraction tool 14, controlled by the sequencer 12, processes the data from the storage unit 2, executing a pre-programmed abstraction procedure ABSTRACT using knowledge read in the storage unit 1.

The abstraction procedure ABSTRACT executes a sequence of steps such that each step consists of replacing, in the area MEMA, the access to the data describing physical elements with an access to new data describing physical components which gathers these physical elements. The new data describing physical components is created by the abstraction tool 14 from knowledge contained in the storage unit 1, for example using the means described in the French patent 2724031. The abstraction tool 14 stores the new data created in the storage unit 2 using the address storage area MEMA. All of the physical components resulting from a step and all of the physical elements not gathered in a step constitute a set of physical elements for the next step.

Before the execution of the abstraction procedure, the data describing physical elements are essentially structural and physical types of data. In the example of physical elements which are integrated circuit primitives such as transistors, diodes, or resistors, the data of the structural type is constituted by a list of the primitives and the connections between these primitives (connection list) and the data of the physical type is constituted, for each primitive, by lists of parameters, such as for example in MOS technology, the width and length of the grid, or the coordinates of the position of the transistor in the circuit. The execution of the abstraction procedure generates new data of the structural and physical type. By taking advantage of the teaching of the French patent 2724031, the execution of the abstraction procedure can also generate data of the behavioral type, which can be expressed in the form of a formal specification. The subject matter of said French patent 2724031 and its counterpart U.S. application Ser. No. 08/515,572, now U.S. Pat. No. 5,734,572, which are assigned to the assignee of the subject application are hereby incorporated herein by reference.

In addition to the address storage area MEMA, the storage unit 2 contains two address storage areas MEMB and MEMC. The areas MEMA, MEMB and MEMC are read- and write-accessible by processing means 8 which execute various set-based operations in the areas MEMA, MEMB and MEMC using a function SELECT controlled by the sequencer 12. Essentially two types of set-based operations are distinguished: operations of the TRANSF type and operations of the FILTR type. Operations of the TRANSF type, at the user's command in the case of a manual intervention, either transfer an area MEMA, MEMB or MEMC to either of the other two areas MEMA, MEMB or MEMC, transfer the union, the intersection or the set-based difference of two areas into either of these two areas or to a third area, or transfer an area's set-based complement relative to another area into either of these two areas or to a third area. Operations of the FILTR type reduce an address storage area MEMA, MEMB or MEMC in order to filter the access to certain data of the storage unit 2 in accordance with criteria which, by way of a non-limiting example, may be physical, topological, logical or electrical. Advantageously, these criteria are defined interactively by the user. An address storage area can be reduced to an empty set.

The result of a set-based operation in the address storage area MEMA provides access to a subset of data initially accessible through the address storage area MEMA. Various advantages of such a result will be seen below, but it is possible at this point to cite the advantage of limiting an abstraction, executed by means of the tool 14, to only the elements described by the data accessible in the address storage area MEMA.

The data of the storage unit 2, accessible through one of the address storage areas MEMA, MEMB or MEMC, are read-accessible to processing means 15 for generating files with different formats such as, for example, LICON, FONC and AUTR, using edit functions EDIT.

The editing of a file in the LICON format makes it possible to obtain a connection list, for example on a part of a physical structure limited to only the elements described by the data accessible in one of the address storage areas MEMA, MEMB or MEMC. This provides the advantage of extracting a physical structure subset in order to analyze it more easily or to integrate it directly into another physical structure. If the data result from abstractions executed by the tool 14, the editing of the LICON format file facilitates the analysis of the physical structure described. The LICON format file can be used by systems for generating automatic schemas or can be subsequently reintroduced into the input interface 4 to be reprocessed by the system of the invention.

A file in the FONC format is intended to contain a set of functional descriptions of complex structures described by data contained in an area MEMA, MEMB or MEMC of the storage unit. The functional descriptions are the same type as those obtained using the tool 14 as described in the patent application FR 9410260. A functional description reduced to a subset of an initial structure facilitates the understanding of it and makes it possible to insert this functional description into an other functional description so as to generate a new physical structure. It is still possible to obtain a complete functional description in order to simply execute a technological migration.

An file in the AUTR format is intended to contain, for example, a set of structural, functional, electrical or other descriptions in accordance with various standard formats adapted for their potential use by other systems.

The data of the storage unit 2, accessible through one of the address storage areas MEMA, MEMB or MEMC, are read-accessible to a graphical interface 7 for executing a display function VISUAL and for generating functional feedback signals RETF to be sent to processing means 8. The interface 7 is connected to a screen, not represented, for displaying the results of the function VISUAL and to a user command interface 5 which allows a human operator to act on the function VISUAL using known means such as a keyboard or a mouse, not represented.

The function VISUAL consists of displaying on the screen the data contained in the areas MEMA, MEMB or MEMC in windows, each of which is dedicated to a particular storage area, and marking in one or more windows the data selected by means of the interface 5. The display in a window of the data of an area MEMA, MEMB or MEMC can occur in various graphical modes called VIEWGRAPE or text modes called VIEWTEXT, controlled through the interface 5. As an example of graphical modes, it is possible to cite a mode called VIEWPHY which displays a physical view describing traces of masks from which the data displayed originated, a mode called VIEWCONTOUR which displays a view describing topological contours of components recognized by the system, a mode called VIEWSCHEMA which displays a view describing an electrical diagram made up of signals and components. As examples of text modes, it is possible to cite a mode called LISIG which displays a list of signal names, a mode called LITYPE which displays a list of components of a given type, a mode called LIRESIDUAL, which displays a list of residual components not recognized by the system. One advantage of the function VISUAL is that it allows switching from one display mode to another in a window by means of a simple command transmitted through the interface 5.

The graphical interface 7 comprises means for displaying various types of views such as physical, topological, logical, schematic or other views, and means for pointing within any of these views to any graphical or textual description in order to locate the description that corresponds to it in another view. For example, by pointing to a topological element, it is possible to obtain cross-references which allow the views of physical and schematic windows to be highlighted or to be centered on the corresponding physical or schematic descriptions.

The graphical interface 7 generates functional feedback signals RETF for controlling the processing means 8 so as to execute in the latter various set-based operations of the function SELECT. The functional feedback signals result from interactions of the human operator with one of the views previously described by means of the interface 5. The interface 7 provides considerable user-friendliness in the control of the processing means 8 by a human operator.

One advantageous aspect of the processing means 15 resides in the generation of knowledge files in the INFOR format which can be reintroduced into the system by means of the interface 3 in order to expand the knowledge contained in the storage unit 1. The generation of the data file in the INFOR format is carried out by means of edit functions EDIT, from the contents of an area MEMA, MEMB or MEMC of the storage unit 2 in the manner that will now be described.

In order to generate data of the INFOR type, the processing means 15 use the data in the LICON format contained, for example, in the area MEMB of the storage unit. Data in the LICON format describe elements of two main types, elements of the COMPONENT type and elements of the CONNECT type. In the case of an electronic circuit, the elements of the COMPONENT type are, for example, transistors or groups of transistors and the elements of the CONNECT type are the connections between these transistors and the open connections between these transistors or groups of transistors and the outside of the electronic circuit. The data of the INFOR type describe the knowledge that makes it possible to control the abstraction tool 14. Knowledge can be described, for example, by means of formalisms using structural description languages or production rule languages. The premise of a rule is constituted by data and free variables describing a model, and the conclusion is constituted by data and free variables describing the model at a higher level of abstraction. In order to describe the model at a higher level of abstraction, the elements of the COMPONENT type occurring in the model are replaced by a single element of the COMPONENT type and the elements of the CONNECT type are replaced by only the elements of the CONNECT type shared by elements outside the model. The description at a higher level of abstraction is constituted by a set of structural data, and possibly by a set of functional data.

Referring to the example of the system with production rules, the processing means 15 create a model by copying the data describing the elements of the COMPONENT type and by replacing the data describing the elements of the CONNECT type with free variables. The processing means 15 then load the model created in this way into the premise of a rule. At the same time, the processing means 15 display on the screen a window RULE using the display interface 7.

The content of the window RULE is constituted, for example, by lines of text organized into different fields delimited by keywords. A first field contains a rule name proposed by default by the means 15. A second field recognized, for example, by means of a keyword "IF" and possibly by means of keywords "WITH" contains the premise of the rule describing the model created. A third field recognized, for example, by means of a keyword "DO," contains a component name proposed by default by the means 15, a structural sub-field recognized, for example, by means of a keyword "STRUCTURE" and possibly a functional sub-field recognized, for example, by means of a keyword "FUNCTION." The structural and functional sub-fields can be filled with lines of text proposed by default or left empty. It is possible by means of the interfaces 5 and 7 to modify all or part of the text displayed in the window RULE. The rule name and the component name can be replaced by words that are more expressive than those proposed by default. The model can be modified in order to better target a desired component. It is possible to write in the structural sub-field a description in a known language such as, by way of a non-limiting example, EDIF or structural VHDL. It is possible to write in the functional sub-field a description in a known language such as, by way of a non-limiting example, VERILOG or behavioral VHDL. Generally, models of circuits are formed from structures for controlling the abstraction process.

Another advantageous aspect of the processing means 15 resides in the generation of statistical files in the STAT format intended to contain encrypted data on the nature and the quantity of elements described by the data contained in an area MEMA, MEMB or MEMC of the storage unit. From each group of data describing an element, processing means 17 execute a function CALCSIG for calculating one or more signatures of this element. For example, if the elements are electronic components constituted by transistors, the signature is calculated by a sequence of arithmetical operations on the dimensions of these transistors and on the coordinates of their relative positions. The sequence of arithmetical operations is executed in such a way that the value of the signature is a significant number of physical and topological properties of the element described by the group of data. This means that all the elements and only the elements having identical physical and topological properties will have the same signature. Any signature calculation method that meets the requirements listed above is appropriate, and it is not necessary to go into further detail here. The result of a signature calculation is stored in the storage unit 2 as an attribute of the element using the address storage area MEMA. These attributes are read-accessible through the address storage area MEMA, MEMB or MEMC, to the processing means 15 for editing a file in the STAT format. If the calculation of the signature of an element provides a new value, the processing means 15 create a data structure constituted by various fields, a first field of which contains an indication of the type of element described, a second field of which contains the value of the signature and a third field of which contains the value of the counter initialized at 1 at the time of the creation. If the calculation of the signature of a given element provides a value contained in the second field of previously calculated data structure, the processing means 15 increment the value contained in the third field. All of the data structures, thus created by the processing means 15 until all of the data contained in an area MEMA, MEMB or MEMC of the storage unit have been exhausted, constitute the STAT type file.

At the command of the operator interface 5, the display means 7 read-access the signature values contained in the storage unit 2 in an address storage area MEMA, MEMB or MEMC, so as to display in a screen window called VIEW-DIAGRAM a graphical representation of a STAT type file, for example in the form of a graph in which pairs (type, signature) are plotted on the ordinate, and the number of recognized elements for each pair are plotted on the abscissa. A graphical representation of this type makes it possible to analyze the diversity of the elements that constitute a complex physical structure such as, for example, an electrical circuit. This also makes it possible to precisely recognize the source or sources of elements from which the complex structure has been constructed. The contents of a STAT type file can also be used by the system for other purposes such as, for example, the highlighted or specially colored display of elements of a view provided by the interface 7 having the same signature. A STAT type file therefore makes it possible to know, for example, which components of an electric circuit have the same electrical properties as well as the same logical properties.

The operator interface 5 makes it possible to start up the system by storing in one or more registers 9 the initialization values VALINIT which indicate, for example, the names of LICON and INFOR format files to be processed by the system, and to shut down the system by storing in one or more registers 10 the end values FIN. These values can be displayed on the screen.

A register 6 contains a set of bistable indicators POSIT such as, for example, P1 for the activation of the interface 3, P2 for the activation of the interface 4, P3 for the activation of the processing means 8, P4 for the activation of the abstraction tool 14 and P5 for the activation of the processing means 15. The values of the indicators POSIT can be loaded by means of the interface 5.

From indicator values POSIT, a sequencer 12 activates the system as a function of execution data contained in one or more registers 11, which can be loaded from the interface 5. For example, P1, P2, P4 and P5, when set, actuate a loading of an INFOR file, a loading of a LICON file, a processing by the tool 14, then an edit of LICON and FONC files by the processing means 15.

The system described with the aid of FIG. 2 offers numerous possibilities for implementing the process described in reference to FIG. 1, including the one that uses, for example, a connection list stored in a computer data file 18 in a given LICON format.

The connection list contains a list of components and a list of connections between these components. The primitives are elementary components such as, for example, transistors, diodes or resistors, labelled by their types such as MOSN, MOSP, NPN or PNP for transistors, and described by their connectors such as grid, drain, source for transistors of the MOS type, by their physical properties such as grid length and width for transistors of the MOS type, and by their geographical position in the structure such as cartesian coordinates. The connections are electrical conductors which link connectors of components to one another (internal connections) or which link connectors of components with the outside of the structure (external connections), for example in order to carry signals. The connections are labelled by the names of the signals they carry.

By means of the operator interface 5, an initialization value VALINIT, which indicates the name of the LICON format file to be processed by the system, is stored in a register 9.

By means of the interface 5, a sequence executed by the sequencer 12, which consists of storing the file 18 in the storage unit 2 by means of the interface 4 and of triggering the processing means 8, is activated.

By means of the display interface 7 and the operator interface 5, a view is displayed on a screen of the system, a view of the data of the storage unit 2. The types of elementary components described by this data are labelled in order to determine the production technology of the structure.

If there is a knowledge file 20 for the technology determined, an initialization value VALINIT, which indicates the name of the INFOR format file to be processed by the system, is stored in a register 9 by means of the operator interface 5.

By means of the interface 5, a sequence executed by the sequencer 12, which consists of storing the file 20 in the storage unit 1 by means of the interface 3 and of activating the abstraction tool 14 and the processing means 15, is activated.

If there is no knowledge file 20 for the technology determined or if the knowledge available is not sufficient to obtain a desired abstraction, the user tries to identify and to model, using EDIT, the components described by the data of the storage unit 2 in the VIEWSCHEMA mode, in order to introduce new knowledge into the system, supplied by a user intervention.

For this purpose, using the interfaces 5 and 7 and the processing means 8, the user selects in the address storage area MEMA subsets made accessible in the address storage areas MEMB and MEMC. Set-based operations are executed in the areas MEMA, MEMB and MEMC. Using the processing means 15, a knowledge file in the INFOR format is created on the results of the set-based operations, then this file is loaded into the storage unit 1 by means of the interface 3. Using the abstraction tool 14, a new abstraction process is activated and the operations described previously are repeated until a satisfactory result is obtained.

Finally, the processing means 15 are commanded to edit a file 19 in the FONC format for containing an abstract functional specification of the structure analyzed.

One skilled in the art will have no difficulty determining numerous other possibilities for the utilization of the system of the invention such as, for example, that of commanding the processing means 15 to edit a file 28 in the LICON format for containing an abstract structural specification of the structure analyzed.

While this invention has been described in conjunction with specific embodiments thereof, it is evident that many alternatives, modifications and variations will be apparent to those skilled in the art. Accordingly, the preferred embodiments of the invention as set forth herein, are intended to be illustrative, not limiting. Various changes may be made without departing from the true spirit and full scope of the invention as set forth herein and defined in the appended claims.

What is claimed is:

1. A process for analyzing a first computerized data set (18) containing a connection list for describing a physical structure (21) of an integrated circuit starting from primitive components of said integrated circuit, said process comprising:
    a step (16) for executing set-based operations on subsets of the first computerized data set (18),
    a structural and functional abstraction step (13) for generating from a subset resulting for said set-based operations a second computerized data set of functional (19) and structural (28) computer data, and producing a display of said second computerized data set in a predetermined form.

2. The process as set forth in claim 1 wherein the predetermined form is a statistical form.

3. The process as set forth in claim 1 wherein the predetermined form is a structural form.

4. The process as set forth in claim 1 wherein the predetermined form is a electrical form.

5. The process as set forth in claim 1 wherein the predetermined form is a schematic form.

6. The process as set forth in claim 1 wherein the predetermined form is a functional form.

7. An analysis process according to claim 1, characterized in that the step (16) for executing set-based operations controls an automatic synthesis step (27) which generates, from the computerized data set of functional computer data (19), a connection list for regenerating a physical structure (21).

8. An analysis process according to claim 1, characterized in that the step (16) for executing set-based operations generates a computerized data set (20) containing knowledge for controlling the structural and functional abstraction step (13).

9. A data processing system comprising an abstraction tool (14), a storage unit (1) connected to said abstraction tool and adapted to contain knowledge data for parameterizing and controlling the abstraction tool (14), a storage unit (2) including a first area (MEMA), a second area (MEMB) and a third area ((MEMC) connected to said abstraction tool and adapted to contain data to be transformed by the abstraction tool (14) and accessible in the first area (MEMA) of the storage unit (2), a graphical interface (7) for displaying data accessed in the first area (MEMA) as well as data accessed in the second area (MEMB) and in the third area (MEMC) of the storage unit (2);

an operator interface (5) for controlling the graphical interface (7); and first processing means (8) controlled by the graphical interface (7) for executing set-based operations on the data accessed in the first, second and third areas (MEMA, MEMB, MEMC) and transferring the result of said set-based operations into any of the first, second, or third areas (MEMA, MEMB, MEMC) of the storage unit (2).

10. A data processing system according to claim 9 comprising second processing means (15) for generating, from the first, second or third areas (MEMA, MEMB, MEMC), a first set of data in a first format (INFOR) that can be loaded into the storage unit (1) and a second set of data in a second format (LICON) that can be loaded into the storage unit (2).

11. A data processing system according to claim 10, characterized in that the system further comprises a sequencer (12) for controlling, in accordance with a given sequence, first and second input interfaces (3, 4), the first processing means (8), the abstraction tool (14), or the second processing means (15), from the operator interface (5).

12. A data processing system comprising a first storage unit (1), a second storage unit (2), a first input interface (3) connected to the first storage unit (1) for storing in the first storage unit (1) a first structured data set in a first format (INFOR), a second input interface (4) connected to the second storage unit for storing in the second storage unit (2) a second structured data set in a second format (LICON), and an abstraction tool (14) for read-accessing a storage area (MEMINF) of the first storage unit (1) to gather data accessed in a first area (MEMA) of the storage unit (2), the second storage unit (2) further including a second area (MEMB) and a third area (MEMC), each of which is adapted for accessing a structured data set in the second format (LICON), and further comprising first processing means (8) for carrying out set-based operations on data accessed in the first, second, and third areas (MEMA, MEMB, MEMC) and transferring the result of said set-based operations into any of the areas (MEMA, MEMB, MEMC) of the second storage unit (2).

13. A data processing system according to claim 12, characterized in that it further comprises third processing means (17) for calculating one or more signatures of each element of a structured data set in the second format (LICON) and for calculating cardinal numbers of elements with identical signatures.

14. A data processing system according to claim 12, characterized in that it further comprises a graphical interface (7) for displaying on a screen the content of the second storage unit (2) accessed in the first, second and third areas (MEMA, MEMB, MEMC) and an operator interface (5) for controlling the graphical interface (7).

15. A data processing system according to claim 14, characterized in that it further comprises second processing means (15) for generating, from the first, second and third areas (MEMA, MEMB, MEMC), a first structured data set in the first format (INFOR) to be sent to the first interface (3) and a second structured data set in the second format (LICON) to be sent to the second interface (4).

16. A data processing system according to claim 15, characterized in that it further comprises a sequencer (12) for controlling, in accordance with a given sequence, the first and second input interfaces (3, 4), the first processing means (8), the abstraction tool (14), or the second processing means (15), from the operation interface (5).

17. A data processing system according to claim 15, characterized in that it further comprises third processing means (17) for calculating one or more signatures of each element of a structured data set in the second format (LICON) and for calculating cardinal numbers of elements with identical signatures.

18. A data processing system according to claim 14, characterized in that the graphical interface (7) comprises means for displaying various views including physical, topological, logical and schematic and means for pointing within any of said views to any graphical or textual description so as to locate a corresponding description in another view.

19. A process for analyzing a first computerized data set (18) containing a connection list for describing a physical structure (21) of an integrated circuit starting from primitive components of said integrated circuit, said process comprising:

a step (16) for executing set-based operations on subsets of the first computerized data set (18), said set-based operations including generating a computerized data set (20) containing knowledge for controlling a structural and functional abstraction step (13);

a structural and functional abstraction step (13) for generating from a subset resulting from said set-based operations a second computerized data set of functional (19) and structural (28) computer data; and producing a display of said data set in a predetermined form.

20. The process as set forth in claim 19 wherein the predetermined form is a statistical form.

21. The process as set forth in claim 19 wherein the predetermined form is a structural form.

22. The process as set forth in claim 19 wherein the predetermined form is a electrical form.

23. The process as set forth in claim 19 wherein the predetermined form is a schematic form.

24. The process as set forth in claim 19 wherein the predetermined form is a functional form.

25. An analysis process according to claim 19, characterized in that the step (16) for executing set-based operations controls an automatic synthesis step (27) which generates, from a computerized data set of functional computer data (19), the connection list for regenerating the physical structure (21).

* * * * *